(12) United States Patent
Cornwell, Jr. et al.

(10) Patent No.: US 6,771,413 B2
(45) Date of Patent: *Aug. 3, 2004

(54) OPTICAL TRANSMISSION SYSTEMS INCLUDING OPTICAL AMPLIFIERS, APPARATUSES AND METHODS

(75) Inventors: Donald M. Cornwell, Jr., Silver Spring, MD (US); John J. Veselka, Jr., Clarksville, MD (US); Stephen G. Grubb, Columbia, MD (US); Thomas D. Stephens, Columbia, MD (US); Ruxiang Jin, Ellicott City, MD (US); Alistair J Price, Columbia, MD (US); Michael C. Antone, Ellicott City, MD (US)

(73) Assignee: Corvis Corporation, Columbia, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/046,962

(22) Filed: Jan. 14, 2002

(65) Prior Publication Data

US 2002/0063949 A1 May 30, 2002

Related U.S. Application Data

(63) Continuation of application No. 09/540,708, filed on Mar. 31, 2000, now Pat. No. 6,356,383.
(60) Provisional application No. 60/127,665, filed on Apr. 2, 1999.

(51) Int. Cl.[7] .................................................. H01S 3/00
(52) U.S. Cl. ..................................... 359/337.1; 359/334
(58) Field of Search ........................... 359/337.1, 337.2, 359/334

(56) References Cited

U.S. PATENT DOCUMENTS

4,315,666 A    2/1982   Hicks, Jr.

(List continued on next page.)

FOREIGN PATENT DOCUMENTS

| EP | 0 734 105 A2 | 9/1996 |
| EP | 0853396 A2 | 7/1998 |
| JP | 07202306 A | 8/1995 |
| WO | WO 98/42088 | 9/1998 |

OTHER PUBLICATIONS

Park, S.Y., et al., Feasibility Demonstration of 10 Gbit/s Channel WDM Network Using Dynamic Gain–Controlled EDFAs, Electronics Letters, 5th Mar. 1998, vol. 34, No. 5., Online No. 19980346.

Dung, J.C., et al., Gain Flattening of Erbium Doped Fibre Amplifier Using Fibre Bragg Gratings, Electronics Letters, 19th Mar. 1998, vol. 34, No. 6., Online No. 19980446.

(List continued on next page.)

Primary Examiner—Mark Hellner

(57) ABSTRACT

Optical systems of the present invention include amplifiers configured to achieve maximum signal channel in a span downstream of the transmitter and amplifier site and to decrease the interaction between the wavelengths at high signal channel powers. In addition, the system can include various types of optical fiber positioned in the network to provide for increased signal channel powers and higher gain efficiencies in the system.

15 Claims, 6 Drawing Sheets

U.S. PATENT DOCUMENTS

| | | |
|---|---|---|
| 4,342,499 A | 8/1982 | Hicks, Jr. |
| 4,401,364 A | 8/1983 | Mochizuki |
| 4,616,898 A | 10/1986 | Hicks, Jr. |
| 4,699,452 A | 10/1987 | Mollenauer et al. |
| 4,728,170 A | 3/1988 | Robertson |
| 4,881,790 A | 11/1989 | Mollenauer |
| 5,039,199 A | 8/1991 | Mollenauer et al. |
| 5,050,949 A | 9/1991 | DiGiovanni |
| 5,083,874 A | 1/1992 | Aida et al. |
| 5,095,519 A | 3/1992 | Dorsey |
| 5,191,586 A | 3/1993 | Huber |
| 5,191,628 A | 3/1993 | Byron |
| 5,228,105 A | 7/1993 | Glista |
| 5,283,686 A | 2/1994 | Huber |
| 5,406,411 A | 4/1995 | Button et al. |
| 5,500,756 A | 3/1996 | Tsushima et al. |
| 5,530,583 A | 6/1996 | Uno et al. |
| 5,541,766 A | 7/1996 | Mizrahi et al. |
| 5,557,442 A | 9/1996 | Huber |
| 5,579,143 A | 11/1996 | Huber |
| 5,633,974 A | 5/1997 | Chia |
| 5,636,301 A | 6/1997 | O'Sullivan et al. |
| 5,651,085 A | 7/1997 | Chia |
| 5,675,432 A | 10/1997 | Kosaka |
| 5,694,512 A | 12/1997 | Gonthier et al. |
| 5,696,615 A | 12/1997 | Alexander |
| 5,717,510 A | 2/1998 | Ishikawa et al. |
| 5,764,406 A | 6/1998 | Newhouse et al. |
| 5,812,710 A | 9/1998 | Sugaya |
| 5,815,299 A | 9/1998 | Bayart et al. |
| 5,861,981 A | 1/1999 | Jabr |
| 5,880,866 A | 3/1999 | Stolen |
| 5,883,736 A | 3/1999 | Oshima et al. |
| 5,900,969 A | 5/1999 | Srivastava et al. |
| 5,903,371 A | 5/1999 | Arecco et al. |
| 5,912,750 A * | 6/1999 | Takeda ..................... 359/124 |
| 5,920,423 A | 7/1999 | Grubb et al. |
| 5,963,361 A | 10/1999 | Taylor et al. |
| 5,999,548 A | 12/1999 | Mori et al. |
| 6,031,646 A | 2/2000 | Sniadower |
| 6,055,092 A | 4/2000 | Sugaya et al. |
| 6,057,959 A | 5/2000 | Taylor et al. |
| 6,081,366 A | 6/2000 | Kidorf et al. |
| 6,122,298 A | 9/2000 | Kerfoot, III et al. |
| 6,163,636 A | 12/2000 | Stentz et al. |
| 6,181,464 B1 | 1/2001 | Kidorf et al. |
| 6,356,383 B1 * | 3/2002 | Conwell, Jr. et al. ........ 359/334 |
| 6,362,916 B2 * | 3/2002 | Wu et al. ................ 359/337.1 |

OTHER PUBLICATIONS

Yu, A., et al., Analysis of Optical Gain and Noise Spectral Properties of Erbium–Doped Fiber Amplifier Cascade, Optical Amplifiers and their Application, Aug. 3–5, 1994, 1994 OSA Technical Digest Series, V14, pp. FB1–1–3/124–126.

Masuda, H., et al., Ultra–Wideband Optical Amplification With a 3–dB Bandwidth of 67 nm Using a Partially Gain Flattened Erbium–Doped Fiber Amplifier and Raman Amplification, Optical Amplifiers and their Application, Aug. 3–5, 1994, 1997 OSA Technical Digest Series, V20, pp. MC3–1–4/40–3.

Sugaya, Y., et al., Novel Configuration for Low–Noise and Wide–Dynamic–Range Er–Doped Fiber Amplifiers for WDM Systems, Optical Amplifiers and their Application, Jun. 15–17, 1995, 1995 OSA Technical Digest Series, V18, pp. FC3–1–4/158–161.

Jacobovitz–Veselka, G.R., et al., Single–Stage Booster Amplifier With Two 980 nm Pumps Stabilized by Fiber Gratings, Optical Amplifiers and their Application, Jun. 15–17, 1995, 1995 OSA Technical Digest Series, V18, pp. FC4–1–4/162–165.

Hansen, P.B., et al., Loss Compensation in Dispersion Compensating Fiber Modules by Raman Amplification, OFC'98 Technical Digest pp. 20–1.

Rottwitt, K., et al., Detailed Analysis of Raman Amplifiers for Long–Haul Transmission, OFC'98 Technical Digest pp. 30–1.

Chernikov, S.V., et al., 10 Gbit/s Error–Free Transmission of 2–ps Pulses Over a 45–km Span Using Distributed Raman Amplification at 1300 nm, OFC'98 Technical Digest p. 31.

Kawai, S., et al., Ultrawide 75 nm 3–dB Gain–Band Optical Amplifier Utilizing Erbium–Doped Fluoride Fiber and Raman Fiber, OFC'98 Technical Digest pp. 32–3.

Dianov, E.M., et al., Highly Efficient 1.3 $\mu$m Raman Amplifier, OFC'98 Technical Digest pp. 33–4.

Rottwitt, K., et al., A 92 nm Bandwidth Raman Amplifier, OFC'98, Post–Deadline Paper PD6–1–4.

Srivastava, A. K., et al., 1 Tb/s Transmission of 100 WDM 10 Gb/s Channels Over 400 km Of TrueWave Fiber, OFC'98, Post–Deadline Paper PD10–1–4.

Masuda, H., et al., Ultra–Wideband Hybrid Amplifier Comprising Distributed Raman Amplifier and Erbium–Doped Fiber Amplifier, Electronics Letters, $25^{th}$ Jun. 1998, vol. 34, No. 13, Online No. 19980935.

Takano, K., et al., An Optical Pre–Amplifier with Automatic Gain Control Function, Proceedings of the 1995 IEICE General Conference, Mar. 27–30, 1995, Fukuoka, Fukuoka Institute of Technology b–1067, p. 513.

Zou et al., Compensation of Raman Scattering and EDFA's Nonuniform Gain in Ultra–Long–Distance WDM Links, IEEE Photonics Technology Letters, vol. 8, No. 1, Jan. 1996, pp. 139–141.

Stentz, A., et al., OSA Trends in Optics and Photonics, vol. 5, Optical Amplifiers and Their Applications. From the Topical Meeting, pp. 350–368, Published: Washington, DC, USA, 1996.

Wen, Senfar, et al., IEEE Phontonics Technology Letters, Feb. 1992, vol. 4, No. 2, New York, US, pp. 189–192, IEEE Log No. 9105789.

Aide, K., et al., Long–Span Repeaterless IM/DD Optical Transmission Experiment over 300 KM using Optical Amplifies, ICC '91, vol. 3, pp. 1228–1232, 1991, Published: New York, NY, USA.

Grubb, S. G., Raman Amplifiers for Broadband Communications, OFC'98, OSA Technical Digest Series vol. 2, 1998, abstract.

* cited by examiner

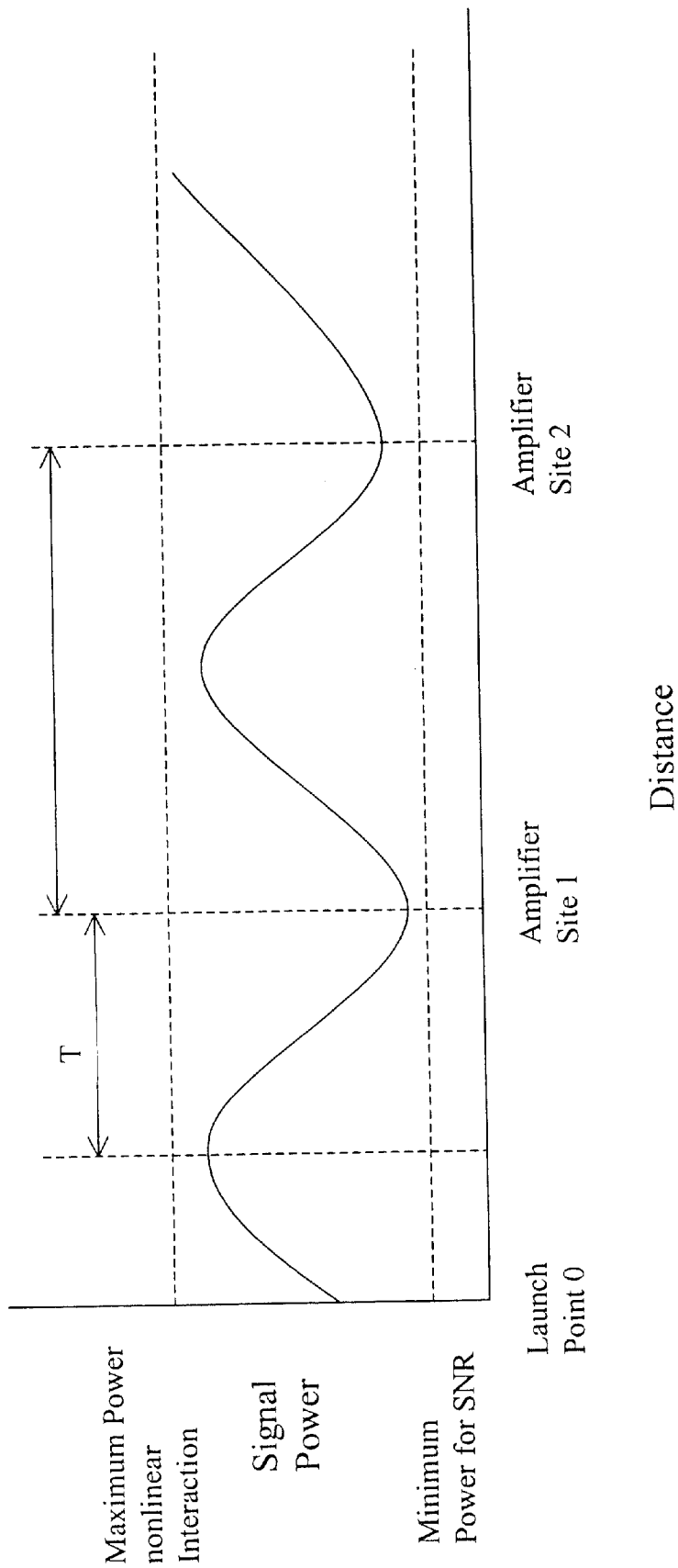

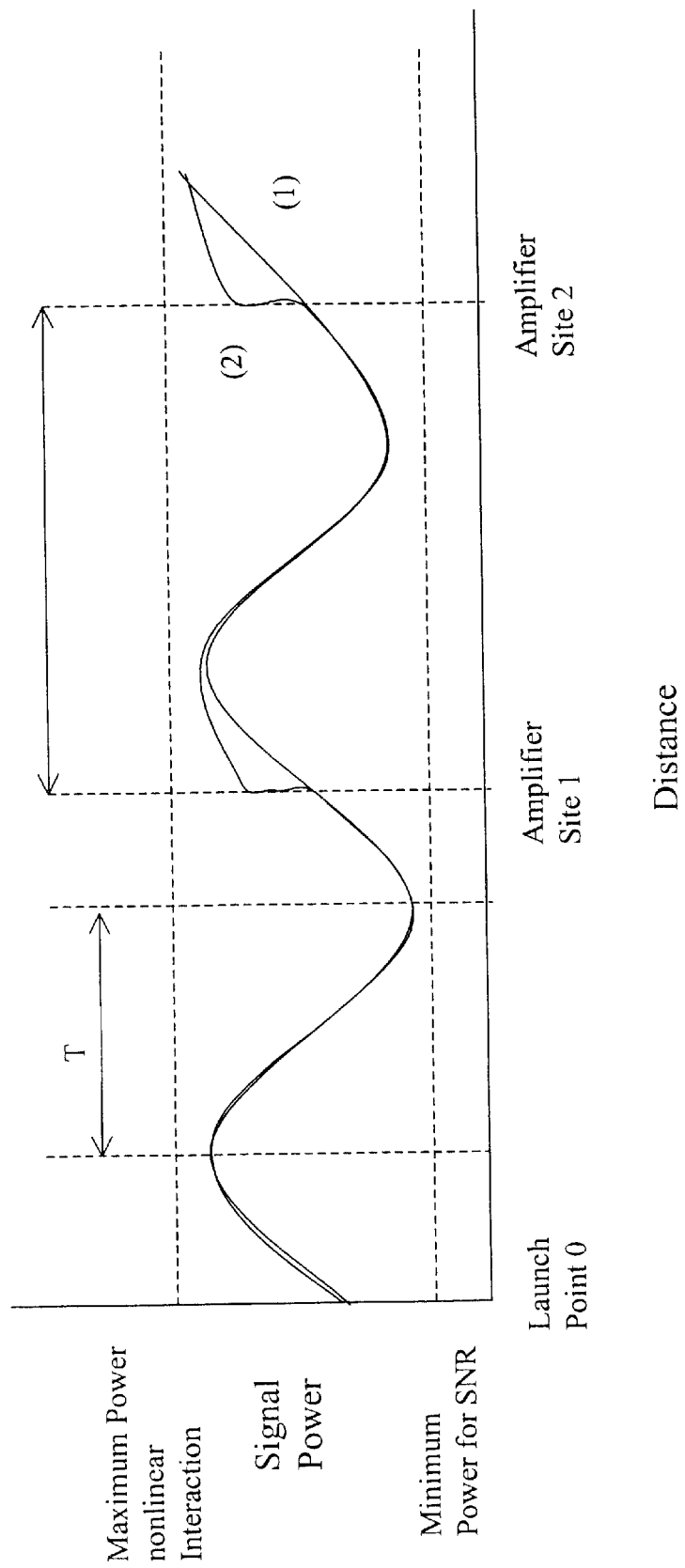

OPTICAL TRANSMISSION SYSTEMS INCLUDING OPTICAL AMPLIFIERS, APPARATUSES AND METHODS

CROSS-REFERENCE TO RELATED APPLICATIONS

This application is a continuation of U.S. patent application Ser. No. 09/540,708, now U.S. Pat. No. 6,356,383 filed Mar. 31, 2000, which is a continuation in-part ("CIP") of commonly assigned U.S. Provisional Application No. 60/127,665 filed Apr. 2, 1999, both of which are incorporated herein by reference.

STATEMENT REGARDING FEDERALLY SPONSORED RESEARCH OR DEVELOPMENT

Not Applicable

BACKGROUND OF THE INVENTION

The present invention is directed generally to optical transmission systems. More particularly, the invention relates to amplifying optical signals in optical transmission systems and controlling nonlinear interactions between signal channels, as well as the amplifier spacing in the optical systems.

Optical communication systems transmit information by generating and sending optical signals corresponding to the information through optical transmission media. Information transported by the optical systems can include audio, video, data, or any other information format. The optical systems can be used in long distance and local telephone, cable television, LAN, WAN, and MAN systems, as well as other communication systems.

Information can be transmitted optically using a broad range of frequencies/wavelengths at high data rates and relatively low cost, which are desirable attributes for high capacity, transmission systems. Also, multiple optical wavelengths that are combined using wavelength division multiplexing ("WDM") techniques into one optical signal that can be transmitted through one optical fiber, which further increases the data carrying capacity of optical systems. As such, optical fiber transmission systems have emerged as a cost-effective alternative to electrical systems for providing high capacity, communication systems.

However, optical transmission systems are not free from attenuation and various forms of degradation that limit the performance of the systems. For example, optical fiber is not a perfect transmitter of electromagnetic radiation in the optical spectrum. Thus, the intensity of an optical signal will attenuate as it travels through the fiber, due to scattering from fiber material imperfections and other degradation mechanisms. In addition, optical noise, from signal attenuation, chromatic dispersion, nonlinear interactions, and other sources, will accumulate and propagate in the fiber along with the signal further degrading the quality of the signal. Furthermore, optical systems generally are not operated in the identical manner, which requires that interfaces be provided to interconnect different optical systems.

It is therefore necessary to regenerate optical signals being transmitted through the optical system to overcome the three primary limitations on optical transport, namely: 1) optical signal attenuation, 2) optical noise accumulation, and 3) optical system interconnectivity. The regeneration of optical signals can be performed either optically or electrically.

The development of optical amplifiers greatly reduced the cost of optical systems, and WDM systems in particular, by essentially eliminating the need to electrically regenerate signal merely to overcome signal attenuation. While the development of optical amplifiers has greatly reduced the equipment costs associated with amplifiers in optical systems, there remain substantial operational costs. Real estate and building acquisition and maintenance costs associated with optical amplifiers can be a sizable portion of the optical system operational costs, which suggests maximizing the distance between optical amplifiers in an optical system. However, maximizing the distance between amplifiers can reduce the maximum distance that optical signals can be transmitted before having to be regenerated to overcome accumulated optical noise.

Additional cost savings in the system can be achieved by increasing the transmission capacity of existing optical fiber compared to installing additional fiber in the system. Therefore, it is desirable to increase the information bit transmission rate in the fiber and the number of wavelengths used to carry information to increase the information carrying capacity of the fiber. However, increasing the bit rate of each channel generally requires the channel spacing to be increased. Furthermore, increasing the bit rate and/or the number of channels often requires that the transmission distance to be decreased, which increases the system cost.

The ability to increase the capacity of the system is limited by the optical signal degradations that occur in the system. Optical signal degradation occurs via numerous mechanisms during transmission in optical fiber. The primary mechanisms are chromatic dispersion and various nonlinear interactions, such as four wave mixing. The degradation caused by these mechanisms increases proportionally as either the bit transmission rate or the number of the channels within a wavelength range is increased.

Generally, information carrying signal wavelengths, or signal channels, are launched into the optical fiber at a maximum signal channel power. The signal channel power decreases as it travels through the fiber until it reaches a minimum signal power, at which time it must be amplified to prevent degradation of the signal. Thus, for a given channel spacing, the maximum signal launch power, minimum signal power, and the attenuation of the fiber establish the maximum amplifier spacing in the system.

The maximum signal launch power is limited to powers below which nonlinear interactions do not cause unacceptable signal degradation. The spacing of the channels as well as other factors, such as the signal channel polarization, affect the maximum signal launch power. Safety concerns may further limit the total power that can be launched into the fiber. The minimum signal power is determined based on the minimum acceptable signal to noise ratio required to reliably transmit information through the system.

The development of optical fiber technology has resulted in fiber having very low attenuation levels (0.25 dB/km) compared to older fiber designs (>0.30 dB/km) in the wavelength range around 1550 nm. The lower loss fiber allows amplifiers to be separated by greater distances for signal transmitted at a given power level and/or lower power signals to be transmitted over greater amplifier spacings.

The different optical fibers used in systems introduce different amounts of chromatic dispersion as a function of optical wavelength. Chromatic dispersion in standard single mode, silica-based, optical transmission fiber, such as SMF-28, generally varies as a function of wavelength. Average dispersion values in standard silica-based fiber are approximately −17 ps/km/nm in the 1550 nm low loss optical transmission window, whereas the wavelength at which zero dispersion occurs (the "zero dispersion wavelength") is typically around 1300 nm.

In optical transmission systems employing standard transmission fiber, chromatic dispersion can severely degrade the optical signal quality and thereby limit the maximum transmission distance. Numerous methods have been developed to effectively counteract dispersion in the standard fiber. For example, dispersion compensating ("DC") fibers have been developed that have high dispersion rates, on the order of $10^2$ pm/km/nm, that are opposite in sign from transmission fiber. The DC fibers can be inserted into the transmission fiber at various locations to maintain the absolute dispersion in the system to within a desired range.

New transmission fibers have been designed to minimize the chromatic dispersion in the 1550 nm window. The new fiber types, generally referred to as low dispersion ("LD") fiber, have much lower dispersion than standard fiber in the range ±5 pm/km/nm for non-zero dispersion shifted ("NZ-DS") fiber, such as Truewave, LEAF, and LS, and even lower for zero dispersion shifted ("DS") fibers. The LD fibers facilitate the optical signal transmission over substantially longer distances before substantial signal degradation occurs as a result of chromatic dispersion. In addition, DC fibers also have been developed to compensate for dispersion in LD fibers.

However, a problem with LD fiber arises from the interrelation of chromatic dispersion and nonlinear interactions. High rates of dispersion tend to decrease nonlinear interactions between closely spaced wavelengths, because the relative velocity of the channels, or "walk-off", decreases the interaction time between the channels. In LD fiber there is much less walk-off between adjacent closely spaced channels resulting in longer interaction time between channels, which increases the nonlinear interaction and resulting degradation of the signal channels.

Nonlinear interactions in LD fiber can be decreased in the system by increasing the spacing between adjacent channels or decreasing the signal channel power. However, increasing the channel spacing generally reduces the total number of channels in the system. Likewise, decreasing the signal channel power generally requires a corresponding decrease in the amplifier spacing and the transmission distance between electrical regeneration sites.

The limitations imposed by nonlinear interactions become increasing problematic for LD fibers at relatively low transmission capacities and short distances. The current methods of reducing the nonlinear interactions in LD fiber greatly decreases the optical system capacity and performance compared to equivalent systems employing standard fiber.

The capacity limitation resulting from non-linear interactions is not limited to LD fiber, but also plagues standard fiber, transmission systems. This limitation will require increased capital and operating expenditures to expand optical communication system capacity. Accordingly, there is an extremely pressing need to overcome the fiber limitations in current optical systems to allow continued growth in communication systems and communications based technology.

BRIEF SUMMARY OF THE INVENTION

The present invention addresses the need for optical transmission systems, apparatuses, and methods having increased flexibility and reliability. Optical systems of the present invention include amplifiers and methods configured to provide increased control over optical signals being transmitted in the systems.

In various embodiments, the optical system and amplifiers are configured to achieve maximum signal channel power in a span downstream of the transmitter and amplifier sites and to decrease the interaction between the wavelengths at high signal channel powers. In addition, the system can include various types of optical fiber positioned in the network to provide for increased signal channel powers and higher gain efficiencies in the system.

In various embodiments, fiber Bragg gratings and other devices are used to control the optical noise in the optical energy supply by optical sources, such as semiconductor laser diodes, to provide for lower noise pump sources. The lower noise pump sources can be used to supply optical energy for amplification to various optical amplifiers, such as Raman and erbium/rare earth doped fiber amplifiers and to control the noise figure of the amplifier.

In addition, the system can include composite gain flattening filters that are used to modify the gain profile produced over a plurality of optical amplifiers. The composite gain flattening filter provides flexibility in the operation of the individual amplifiers, which can be dynamically controlled to accommodate changes in the system and to the optimize the performance of the composite filter.

Accordingly, the present invention addresses the aforementioned concerns by providing optical systems apparatuses, and methods having increased performance and reliability. These advantages and others will become apparent from the following detailed description.

BRIEF DESCRIPTION OF THE DRAWINGS

Embodiments of the present invention will now be described, by way of example only, with reference to the accompanying drawings for the purpose of illustrating present embodiments only and not for purposes of limiting the same, wherein like members bear like reference numerals and:

FIGS. 3(a&b) show signal power versus distance curves in the present invention;

FIGS. 4–5 show optical amplifier embodiments of the present invention; and,

DESCRIPTION OF THE INVENTION

Figure 1:
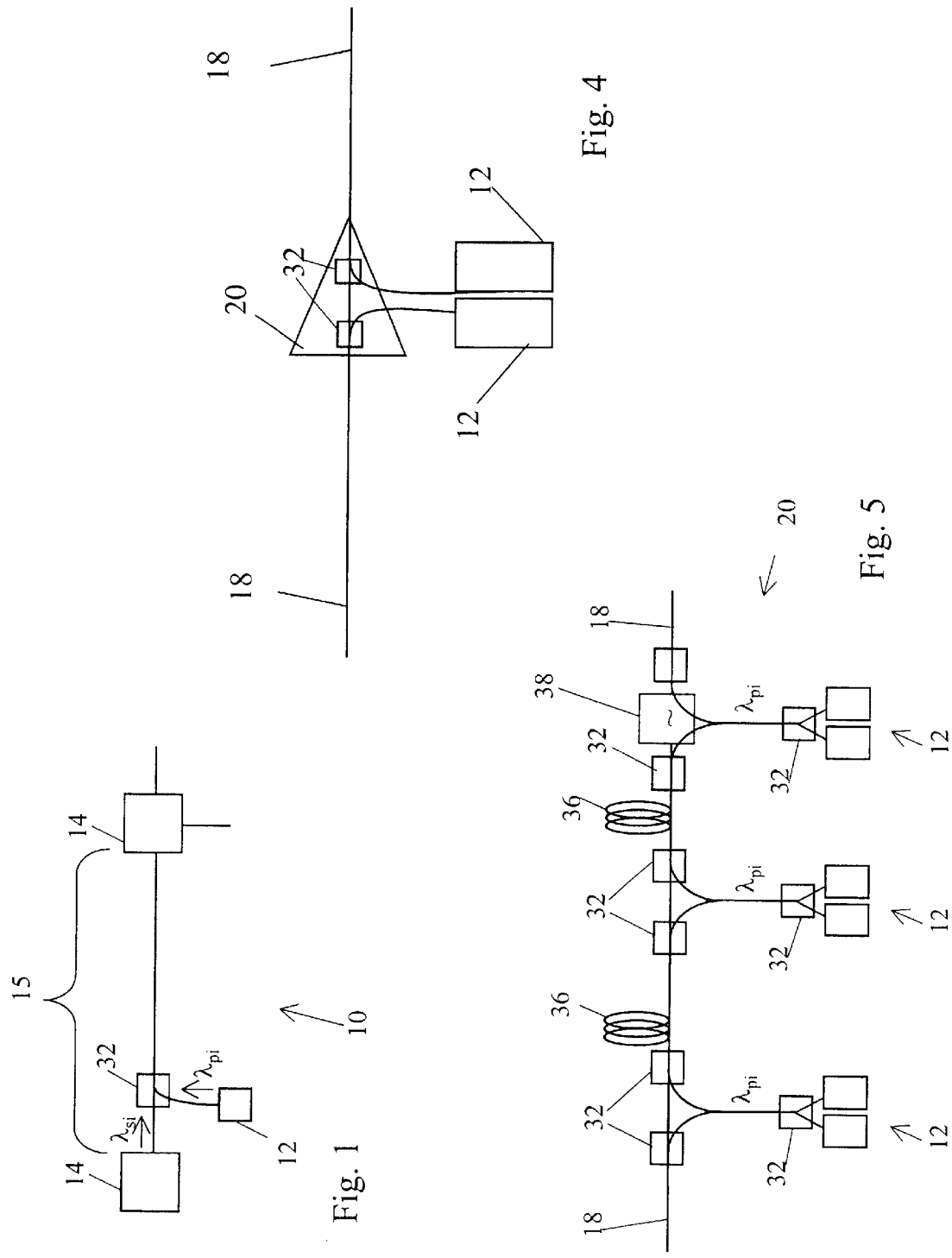
FIGS. 1–2 show optical communication systems of the present invention.
Figure 2:
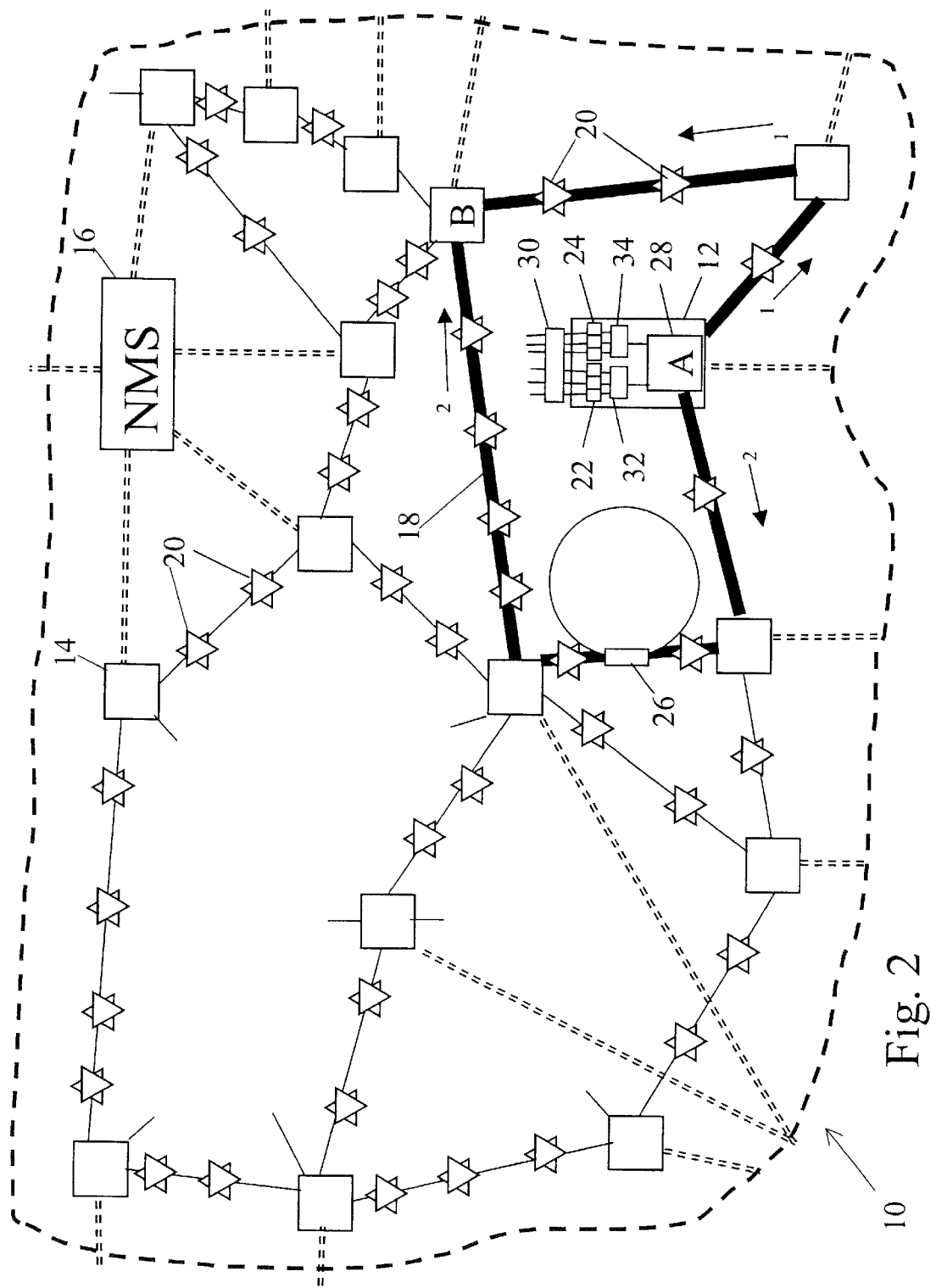

FIG. 1 shows an embodiment of an optical system 10, in which an optical energy pump source 12 is deployed between two optical nodes 14. The optical system 10 can be controlled by a network management system 16 and pump sources 12 configured to operate in one or more serially connected point to point links (FIG. 1) or in multi-dimensional networks (FIG. 2). The network management system 16 can communicate with the various nodes and elements in the optical systems 10 via wide area, data communication networks external to the system 10 and/or supervisory optical channels within the system 10.

The optical nodes 14 can be interconnected optically via guided and unguided transmission media, which is typically optical fiber waveguide 18. Optical amplifiers 20 typically will be provided along optical links 15 of sufficient length where amplification will be required to overcome optical signal attenuation or proximate other components to overcome component losses in the system 10.

One or more transmitters 22 can be included in the nodes 14 and configured to transmit information via the optical signals in one or more information carrying signal wavelengths, or signal channels, $\lambda_{si}$. Similarly, one or more optical receivers 24 can be provided in various nodes 14, each configured to receive one or more signal channels $\lambda_{si}$ from the fiber 18.

The optical processing nodes 14 may also include other optical components, such as one or more add/drop devices 26 and optical and electrical switches/routers/cross-connects 28 interconnecting the transmitters 22 and receivers 24. For example, broadcast and/or wavelength reusable, add/drop devices, and optical and electrical/digital cross connect switches and routers can be configured via the network management system 22 in various topologies, i.e., rings, mesh, etc. to provide a desired network connectivity.

The transmitters 22 used in the system 10 will generally include a narrow bandwidth laser optical source that provides an optical carrier. The transmitters 22 also can include other coherent narrow or broad band sources, such as sliced spectrum sources, as well as suitable incoherent optical sources, such light emitting diodes and fiber lasers, as appropriate. Information can be imparted to the optical carrier either by directly modulating the optical source or by externally modulating the optical carrier emitted by the source. Alternatively, the information can be imparted to an electrical carrier that can be upconverted using the optical carrier onto an optical wavelength to produce the optical signal. Similarly, the optical receiver 24 used in the present invention can include various detection techniques, such coherent detection, optical filtering and direct detection, and combinations thereof. Employing tunable transmitters 22 and receivers 24 in the optical nodes 14 in a network, such as in FIG. 2, can provide additional versatility in the system 10.

The transmitters 22 and receivers 24 can be also connected to interfacial devices 30, such as electrical and optical cross-connect switches, IP routers, etc., to provide interface flexibility within, and at the periphery of, the optical system 10. The interfacial devices 30 can be configured to receive, convert, and provide information in one or more various protocols, encoding schemes, and bit rates to the transmitters 22, and perform the converse function for the receivers 24. The interfacial devices 30 also can be used to provide protection switching in various nodes 14 depending upon the configuration.

Generally speaking, N transmitters 22 can be used to transmit M different signal wavelengths to J different receivers 24. In various embodiments, one or more of the transmitters 22 and/or receivers 24 can be wavelength tunable to provide wavelength allocation flexibility in the optical system 10. In addition, the system 10 can also be configured to carry uni- and bi-directional traffic.

Optical combiners 32 can be used to combine the multiple signal channels $\lambda_{si}$ into WDM optical signals, as well as multiple pump wavelengths $\lambda_{pi}$ for transmission in the fiber 18. Likewise, optical distributors 34 can be provided to distribute the optical signal to the receivers 24j and optical signal and pump wavelengths $\lambda_{pi}$ to multiple paths. The optical combiners 32 and distributors 34 can include various multi-port devices, such as wavelength selective and non-selective ("passive"), fiber and free space devices, as well as polarization sensitive devices. The multi-port devices can various devices, such as circulators, passive, WDM, and polarization couplers/splitters, dichroic devices, prisms, diffraction gratings, arrayed waveguides, etc.

The multi-port devices can be used alone or in various combinations along with various tunable or fixed wavelength filters in the optical combiners 32 and distributors 34. The filters can include various transmissive or reflective, narrow or broad band filters, such as Bragg gratings, Mach-Zehnder, Fabry-Perot and dichroic filters, etc. Furthermore, the combiners 32 and distributors 34 can include one or more stages incorporating various multi-port device and filter combinations to multiplex, consolidate, demultiplex, multicast, and/or broadcast signal channels $\lambda_{si}$ and pump wavelengths $\lambda_{pi}$ in the optical systems 10.

In various embodiments, the optical systems 10 include transmitters 22 that are configured to launch the optical signals below the nonlinear limits for the maximum signal launch power. Likewise, optical amplifiers 20 are configured such that the optical signals are not amplified to the maximum signal power at discrete amplifier sites. Instead, the optical signals are amplified during transmission in the fiber 18 such that the maximum signal channel power in the link 15 is achieved downstream from nodes and amplifier sites using distributed amplification.

Amplification of the optical signals to maximum power during transmission generally is performed using stimulated Raman scattering of optical energy co-propagating with the signal channels. The optical fiber 18 or other transmission media generally will be a silica-based waveguide or other material compositions that produces Raman scattering of optical energy in the material resulting in Raman amplification of the signal channels $\lambda_{si}$. However, various embodiments can include doped transmission fiber or fiber designed for use with other amplification techniques to provide for distributed amplification in the transmission fiber.

By moving the location of the maximum channel power downstream of the transmitters 22 and the amplifiers 20, the physical distance between the optical amplifiers 20 actually can be increased, while the effective amplifier spacing is decreased. FIGS. 3(a&b) depicts optical signal power variations during transmission through the fiber 18 as a function of distance. The curve in FIG. 3(a) depicts the variations in the signal channel powers that are amplified by co-propagating Raman amplification after being launched into the fiber 18 and at discrete amplifier sites 1 and 2. The distance designated as T in FIG. 3(a) shows the maximum amplifier spacing achievable by maximizing the signal launch power. This can be contrasted to the amplifier spacing of the present invention as shown by the spacing between the launch point 0 and amplifier sites 1 and 2.

FIG. 3(b) is similar to FIG. 3(a), except additional amplification is provided via counter-pumped distributed amplification and/or concentrated amplification at the amplifier site. As shown in FIG. 3(b), both co- and counter-pumping the fiber 18 can further increase the distance between the launch point and the first amplifier and the amplifier before the next node 14.

Curve 1 in FIG. 3(b) depicts the signal power assuming distributed Raman gain resulting from both co-pumping and counter-pumping the transmission fiber 18 using an amplifier configuration similar to that shown in FIG. 4. The skilled artisan will appreciate that each pump source 12 shown in the drawings can be configured to include various numbers of pumps and combinations of pump wavelengths.

Similarly, curve 2 in FIG. 3(b) shows the effect of including a concentrated, or lumped, amplifier stage 36 at each amplifier site, such as shown in FIG. 5, which includes two concentrated amplifiers 36 for exemplary purposes. The optical amplifier 20 can include one or more serial and/or parallel amplifier stages, which may include combinations of one or more, distributed and concentrated amplifier stages. The optical amplifiers 12 may also include remotely pumped doped fiber or Raman amplifying fibers 36 having different amplification and transmission characteristics, e.g., dispersion, etc., than the transmission fiber 14. The remotely pumped amplifying fiber 36 can be pumped with excess pump power supplied to provide Raman gain in the transmission fiber 14 or via a separate fiber. In addition, the optical amplifiers 20 can include lumped fiber amplifier stages operated in deep saturation using pump power being supplied to other stages.

Other optical signal varying devices, such as attenuators, filters, isolators, and equalizers can be deployed before, between, and after various stages of the amplifier 12 to decrease the effective loss associated with the devices. Similarly, signal processing devices, such as add/drop devices, routers, etc. can be included proximate the various amplifier stages.

Contrary to traditional optical systems, if the amplifier spacing is to be increased in various embodiments of the present invention, the signal launch power will be decreased. Likewise, the signal power emerging from the optical amplifier sites also will be decreased. The signal launch power is lowered to extend the distance from the transmitter 22 and amplifier 20 at which the signal channels will achieve maximum power. The cumulative slope of the Raman gain and fiber attenuation versus distance will determine the location at which the maximum signal channel power will be achieved downstream of the nodes 14 and amplifiers 20.

The nonlinear interaction limit on signal power and the minimum power level required to provide a signal to noise ratio to allow detection with an acceptable bit error rate define a transmission window for fiber. Employing various coding techniques, such as forward error correction "FEC", can expand the transmission window by enabling a finite number of transmission errors to be corrected following transmission. The number of transmission errors that can be corrected depends upon the particular coding schemes used. Therefore, the systems 10 can tolerate increased signal degradation resulting higher levels of nonlinear interactions and lower signal to noise ratios.

Pump sources 12 generally include one or more optical sources, or pumps, configured to introduce optical energy, or pump power, in one or more pump wavelength $\lambda_{pi}$ bands into the fiber 18 to produce Raman gain in the optical signal wavelengths, or channels, $\lambda_{si}$. The optical sources are typically semiconductor laser diodes, the emission bandwidth and power of which is tailored to the specific system. Other narrow or broad band, coherent and incoherent sources, such as optical noise sources, fiber lasers, light emitting diodes, etc. that can provide sufficient optical energy also can be used in the system 10.

Figure 6:
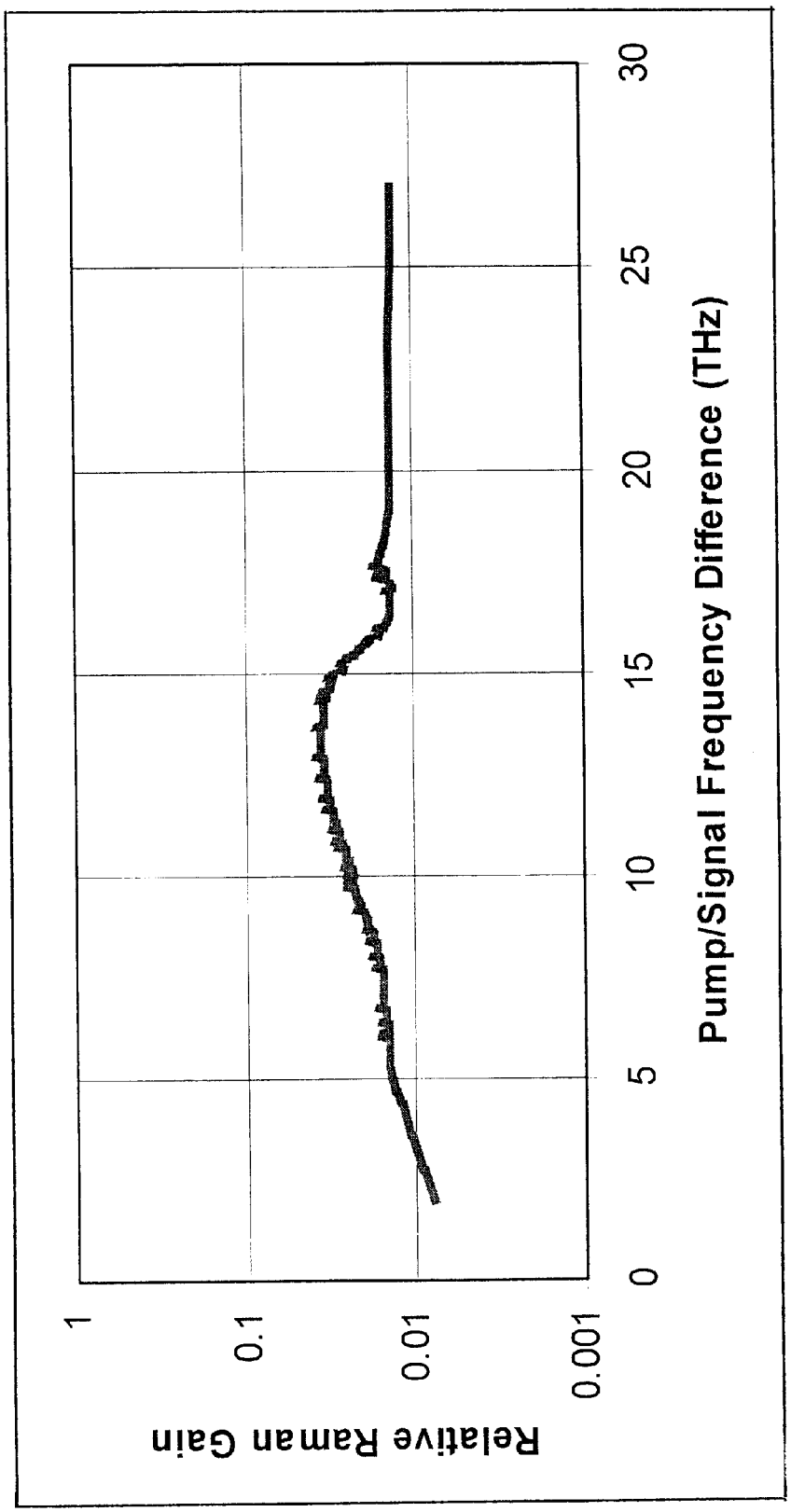
FIGS. 6–7 show Raman gain profiles.

As shown in FIG. 6, the introduction of pump power in one wavelength/frequency band can produce Raman amplification of optical signal channels in another wavelength/frequency band. In fact, the pump wavelengths $\lambda_{pi}$ can be selected and the pump source 12 operated to allow for dynamic control over the amplification, or gain, profile of the signal channels being amplified. Exemplary optical amplifiers 20 providing for dynamic control are described in U.S. patent application Ser. Nos. 09/119,556 and 09/253,819, which are incorporated herein by reference.

As described in the incorporated references, the pump source 12 within the amplifiers 20 can be configured to operate in concert with other optical amplifiers 20 in the system 10. For example, the optical amplifiers can include pump sources 12 to provide for distributed and/or concentrated amplification using counter-pumping and/or copumping.

In various embodiments, the fiber spans extending between the nodes 14 and amplifier 20 are co-pumped using a first set of one or more pump wavelengths $\lambda_{p1i}$ and are counter-pumped using a second set of one or more pump wavelengths $\lambda_{p2i}$. The first and second sets of pump wavelengths $\lambda_{p1i}$ and $\lambda_{p2i}$ are selected to minimize the gain variation across the signal wavelength range as described in the incorporated references.

The gain profile of the distributed amplification can be controlled in various embodiments by varying the pump power delivered in each of the pump wavelengths counter-pumping of a span of fiber between amplifier locations. While the gain profile can be controlled, the noise figure of the amplifier 20 will tend to be higher for signal channels at shorter wavelengths that are amplified correspondingly by the shorter pump wavelengths. As such, the signal to noise ratio of the signal channels tends to degrade more rapidly at the shorter wavelength signal channels, thereby limiting the overall transmission distance of the signal channels.

In one aspect of the present invention, it was found that selectively co-pumping the span in addition to counter-pumping the fiber span can be used to vary the noise figure of the amplifier 20. The co-pumping thereby provides a means to control the noise figure profile over the signal wavelength range, in addition to the gain profile. In these embodiments, co-pumping with optical energy in the shorter pump wavelengths can be used to lower the noise figure for shorter wavelength channels relative to longer wavelength signal channels, while tending to lower the effective noise figure of amplifier for the entire signal channel range.

In exemplary embodiments, the counter-pumped, second set of pump wavelengths $\lambda_{p2i}$ can be equally or unequally distributed across an entire pump wavelength range. Whereas, the first set of pump wavelengths $\lambda_{p1i}$ may not cover the entire pump wavelength range, but may be limited to one or more co-pump wavelengths in the shorter wavelength end of the range to control the noise figure. The co-pumped wavelengths $\lambda_{p1i}$ also can be used to provide some level of Raman amplification to the shorter signal channel wavelengths and to the longer pump wavelengths used to counter-pump the signal channels. For example, pump wavelengths ranging from approximately 1410–1490 nm can be used to counter-pump transmission fiber 18 to provide distributed Raman amplification of signal channels $\lambda_{si}$ in the 1520–1570 nm wavelength range. One or more pump wavelengths in the 1410–1430 range can be used to co-pump the transmission fiber to control the amplifier noise figure for the signal channels. Similarly, other signal channel ranges, such as 1520–1630 nm, 1300–1310, etc. can be used to transmit signals depending upon the attenuation of the particular fiber 18 in the system 10. It will be appreciated that more than one wavelength ranges can be used to transmit signal channels, each of which can be amplified using Raman amplification supplied with pump power in a corresponding wavelength range.

The selection of pump wavelengths used in the system 10 will depend upon the signal channel wavelengths and the type of fiber being used in the system 10 and the various nonlinear interactions between the wavelengths. For example, single frequency pumps can used to control nonlinear interactions between the pump and signal wavelengths and the location and intensity of mixing products in the system 10. In the present invention, low speed dithering below the signal bit rate, e.g., <1 MHz, of the pump frequency can be used to minimize stimulated Brillouin scattering ("SBS") interactions and avoid non-linear interactions, such as four wave mixing. High speed dithering significantly above the channel bit rate, e.g., 5×, can also be employed, if it is only necessary to minimize SBS as in the prior art.

While controlling the pump power supplied by the various pump sources 12 provides increased flexibility in controlling the gain profile of the amplifier 20, the discrete nature of the Raman gain associated with each pump wavelength can introduce some variations into the gain profile. The gain variations can accumulate, when amplifiers 20 including discrete pump wavelengths $\lambda_{pi}$ are cascaded in the system 10.

Figure 7B:
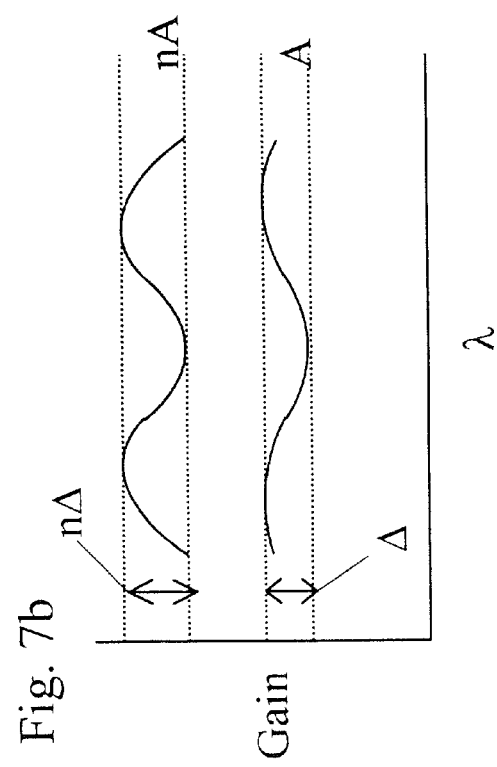
Figure 7A:
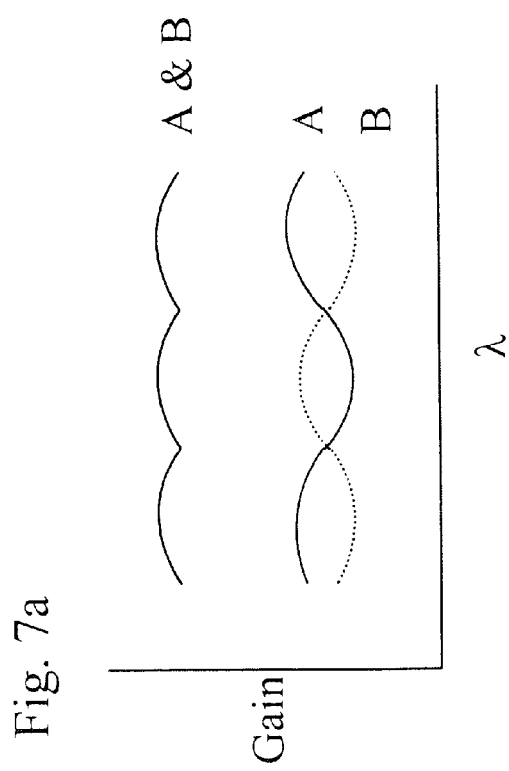

In the present invention, a composite gain flattening filter 38 in combination with a plurality of Raman amplifiers to collectively equalize gain variations from a desired gain profile, as shown in FIGS. 7a–7b. The composite Raman filter can be matched to and configured to control the gain profile based on the composite pump wavelengths $\lambda_{pi}$ of a plurality of Raman amplifiers. Unlike gain flattening filters of the prior art, the present invention does not attempt to perform gain filtering at each amplifier. Instead, gain flattening filters 38 of the present invention are designed based on a composite gain variation profile from a plurality of optical amplifiers 20, thereby reducing the extent and precision of the filtering required to control the gain profile. In addition, the composite gain flatten filters 38 allow for the gain in the individual amplifiers 20 to be varied without affecting the performance of the filter 20, because the composite gain of the amplifiers 20 is being filtered. As such, the performance of the filters 38 in present invention does not require each amplifier 20 to be operated in a fixed mode to ensure proper control of the gain profile, as in the prior art.

In addition, the composite gain filtering does not require the precision of individual amplifier filtering, because there are fewer devices used in the system which reduces the accumulation of errors. This provides additional flexibility in the design of the filters 38. In fact, the gain profile of the amplifiers 20 being filtered can be varied to accommodate variations in the gain flattening profile of the filter 38.

Periodic gain flattening also allows the amplifier 20 to be operated dynamically to adjust for changes in the system performance without being limited to maintaining a specific gain shape at each amplifier 20. For example, if a laser diode fails in one of the amplifiers, it may be necessary to vary the gain profiles in the other amplifiers to compensate for the failed amplifier. Thus, each of the amplifiers in an amplifier chain being gain flattened by the filter 38 can be operated to provide a different gain profile than during normal operation, but the composite gain profile at the filter 38 could be maintained. As such, it is possible to compensate for system changes and maintain system performance through the use of a composite Raman gain flattening filter 38.

A limitation of co-pumped Raman amplification is that when the signal channels are launched near maximum power, the pump wavelengths and the signal wavelengths can cause interference with each other, which is referred to as crosstalk interference. In saturated amplifiers, the signal channels can cause a pattern dependent depletion of the optical energy in the pump wavelengths, which can then be transferred to other signals. Crosstalk occurs in co-pumping scenarios to a greater extent because the walk-off between pump wavelengths and signal channels is limited to the dispersion rate in the fiber. Whereas, in counter-pumped Raman amplifiers, pump depletion generally is averaged, because of the rate at which the pump wavelengths counter-propagate relative to the signal channels.

However, if the signal channel powers are reduced sufficiently, the co-pumped Raman amplifier can transition to unsaturated regime where crosstalk is substantially reduced. In this regime, co-pumped Raman amplifiers can be used to provide additional gain in the fiber span. The walkoff between signal channels and the pump wavelengths also is affected by the dispersion difference between standard and LD fibers. The dispersion profile in LD fibers are controlled by waveguide design and not material dispersion as in standard fiber. Thus, the dispersion difference between pump and signals can be greater in some LD fibers than in standard fiber.

In co-pumped Raman amplifiers, intensity noise in the pump sources 12 can be transferred from the pump wavelengths onto the signal channels more readily than when counter-pumped. Therefore, it generally is desirable to use pump sources 12 that have low noise characteristics, such as single frequency diodes. Also, the pump sources 12 can generally be constructed using fiber Bragg gratings in polarization maintaining ("PM") fiber pigtails on diode lasers as discussed in the incorporated applications to control the emission wavelength range.

In one aspect of the present invention, the positioning of the Bragg grating relative to the optical source, e.g. laser diode, can be used to control the noise spectra of the emitted optical energy. It is generally desirable to position the Bragg grating in the PM pigtail, such that relative intensity noise generated by relaxation oscillations of the external cavity are at sufficiently high frequencies that the noise will not be imprinted on the signal channels. For example, positioning the Bragg grating or other external cavity device close to the output facet of the cavity can reduce the noise. In addition, the output facet of the laser cavity can be provided with an anti-reflective ("AR") coating and/or angled to suppress relative intensity noise due to competition between external cavity modes and the internal lasing modes of the laser. Generally, it is desirable to minimize the relative intensity noise associated with the pumps, for example, less than −130 dB/Hz, to minimize the imprinting of noise onto the signal channels.

In addition, fiber Bragg gratings or other bandwidth controlling devices can be used to control the emission wavelength range of the optical sources, so the pump power can be efficiently combined through the pass band of WDM couplers and other WDM pass band devices. In the present invention, the pump source 12 in the amplifier 20 includes WDM couplers having pass bands outside the pump wavelength range required to provide Raman amplification to the signal channels being used in the system 10. For example, fused tapered WDM couplers can be cascaded to span the desired pump wavelength range. Fiber Bragg gratings can be used to control the emission spectra of the optical sources to be within the pass bands of the couplers. These embodiments can provide for a scalable, non-service interrupting expansion of the signal channel capacity of the system 10. Pump wavelengths can be added to the pump source 12 in the unused pass bands to expand the amplification range of the amplifier 20 and the available signal channel wavelength range during operation.

Additionally, the Raman gain achieved in the span is dependent upon the relative polarization of the signal channels and the pump wavelengths. Polarization dependent gain can by reduced or eliminated by depolarizing the pump light. Linearly polarized output from these pumps can be coupled to polarization maintaining ("PM") fiber with its electric field vector polarized at 45 degrees to a polarization axis of the PM fiber to depolarize the output. Some higher power applications require multiple pumps to be multiplexed together, such as embodiments shown in FIG. 5. This can be done using a polarization beam splitter/combiner ("PBC") 24 to combine the pump wavelengths. PM fiber can be placed after the polarization combiner 24 to depolarize the light from both pumps. When the same pump wavelengths are combined using a PBC the combined power is effectively depolarized. However, in the absence of a depolarizer following the PBC, the failure of one of the two optical sources will result in a linearly polarized output from the PBC.

The launched signal channel power and relative maximum signal channel powers at the transmitters 22 and amplifiers 20 can be tailored to accommodate variations in the nonlinear interaction limits across the wavelength range. For example, in LD fibers, the dispersion profile and non-linear interaction profile strongly varies across the signal channel band. Therefore, the signal channels can be launched having varying channel powers, which can be compensated by varying the Raman amplification of the channels accordingly. The net gain across one complete span between amplifiers can be made to be flat, but the nonlinear penalties can be minimized, by varying the relative signal channel powers along the span.

As discussed in the incorporated applications, additional amplification may be possible by co-pumping the fiber span with pump wavelengths in the 1320–1410 nm range to amplify the counter-pump wavelengths in the 1410–1490 nm range. As also discussed, a doped section of fiber, i.e., erbium, can be spliced into the span at an appropriate location, which will be pumped by remnant pump energy and provide additional amplification. However, the inclusion of a doped fiber could limit the signal channel wavelength range.

The maximum signal channel launch power in LD fibers is substantially lower than in standard fiber. As such, it is necessary to achieve increased levels of Raman gain to achieve LD fiber system performance that is comparable to the performance of standard fiber systems. An advantage of LD fibers is that the Raman cross section is generally smaller than standard fiber; therefore, higher Raman gains are achievable for the same pump power in LD fibers. The improved Raman gain performance tends to offset to some extent the lower launch powers. Also, because the LD fiber was designed to have very low dispersion, it can reduce the number of dispersion compensating components and fibers required in the system.

It may be desirable to combine fiber types along a span between nodes and/or amplifiers to obtain the benefits associated with each fiber type. For example, standard fiber or higher dispersion fiber could be deployed as the transmission fiber 18 in regions of the system in which the signal channel power is high. Such regions include the transmission fiber 18 following transmitters 22 and amplifiers 20 in the system 10. The use of high dispersion fiber in high power regions allows for higher maximum signal channel powers.

Analogously, LD fiber would be particularly useful in regions where the signal channel power is low. For example, LD fiber can be placed before amplifiers and receivers in the system, where the signal power is low. The inclusion of LD fiber regions would substantially decrease the overall dispersion in the system, which could substantially reduce or eliminate the need for DC components and fibers. Additionally, the higher Raman gain achievable in LD fiber would enable more efficient pump utilization and distributed amplifier performance.

In application, a first section extending from the transmitters 22 and output of the amplifiers 20 could be a larger core fiber, such as SMF-28-like standard transmission fiber, that allows for higher signal powers than in smaller LD fiber. Second section of smaller core fibers, such as the LD fiber, can be used in lower signal power regions, such as before receivers 24 and amplifiers 20, where the smaller core fiber can provide increased Raman gain efficiencies. Other fibers can be interleaved between the first and second fiber sections as may be appropriate to achieve various objectives in the systems.

The benefits associated with other fiber types could also be leveraged by appropriately positioning of fiber in the transmission path. Hybrid fiber types could be most cost effectively deployed at the time a new fiber path is installed, particularly in festooned and undersea systems. In existing systems, retrofitting one or more different fibers into an existing fiber plant may not be a cost effective proposition. However, in fiber paths that contain multiple fiber types, it may be possible to interleave the existing fibers, for example at junction boxes, to produce a hybrid fiber having increased performance.

Those of ordinary skill in the art will appreciate that numerous modifications and variations that can be made to specific aspects of the present invention without departing from the scope of the present invention. It is intended that the foregoing specification and the following claims cover such modifications and variations.

What is claimed is:

1. A method of transmitting optical signals, comprising:

transmitting optical signals, in an optical signal wavelength range, via a transmission media;

amplifying the optical signals a plurality of times at a plurality of separate locations to produce a composite optical signal gain profile, wherein amplifying includes counter pumping optical energy in the transmission media in a first pump wavelength range and co-pumping optical energy in the transmission media in a second pump wavelength range to produce Raman amplification of the optical signals; and wherein counter pumping includes producing a counter pumping noise figure profile over the optical signal wavelength range corresponding to the Raman amplification; and wherein co-pumping includes varying the counter pumping noise figure profile over at least a portion of the optical signal wavelength range; and filtering the composite optical signal gain profile produced by amplifying the optical signal a plurality of times to produce a desired gain profile for the optical signals.

2. A method of transmitting optical signals, comprising:

transmitting optical signals, in an optical signal wavelength range, via a transmission media;

amplifying the optical signals a plurality of times at a plurality of separate locations to produce a composite optical signal gain profile;

filtering the composite optical signal gain profile produced by amplifying the optical signal a plurality of times to produce a desired gain profile for the optical signals;

varying individual gain produced in at least one occurrence of amplifying the optical signals; and maintaining a constant state of filtering the composite optical signal gain profile while varying of the individual gain produced in at least one occurrence of amplifying the optical signals.

3. A method of transmitting optical signals, comprising:

transmitting optical signals, in an optical signal wavelength range, via a transmission media;

amplifying the optical signals a plurality of times at a plurality of separate locations to produce a composite optical signal gain profile, wherein amplifying the optical signals includes varying amplification of the optical signals over time; and filtering the composite optical signal gain profile produced by amplifying the optical signal a plurality of times to produce a desired gain profile for the optical signals, wherein filtering the composite optical signal gain profile includes applying a constant filter to the composite gain profile while varying amplification of the optical signals.

4. A method of transmitting optical signals, comprising:

transmitting optical signals, in an optical signal wavelength range, via a transmission media;

amplifying the optical signals a plurality of times at a plurality of separate locations to produce a composite optical signal gain profile;

filtering the composite optical signal gain profile produced by amplifying the optical signal a plurality of times to produce a desired gain profile for the optical signals;

monitoring changes in the gain profile produced from filtering the composite optical signal gain profile; and amplifying the optical signals differently to produce a different composite optical signal gain profile in response to changes in the gain profile produced from filtering the composite optical signal gain profile.

5. A method of transmitting optical signals, comprising:

transmitting optical signals, in an optical signal wavelength range, via a transmission media;

amplifying the optical signals a plurality of times at a plurality of separate locations to produce a composite optical signal gain profile;

filtering the composite optical signal gain profile produced by amplifying the optical signal a plurality of times to produce a desired gain profile for the optical signals;

monitoring system performance; and amplifying the optical signals differently to produce a different composite optical signal gain profile in response to changes in the system performance.

6. An optical system, comprising:

optical transmission media;

a transmitter having an optical output connected to the transmission media;

a plurality of amplifiers optically connected to the transmission media at a plurality of separate locations and collectively producing a composite optical signal gain profile, wherein at least one of the amplifiers includes a relative intensity noise controlled pump source having a band pass filter optically connected between the transmission media and output of at least one pump source to form an external cavity;

a receiver optically connected to the transmission media; and a filter optically connected to the transmission media between the amplifiers and the receiver, wherein the filter corresponds to the plurality of amplifiers and produces a desired gain profile in response to the composite optical signal gain profile.

7. The method of claim 1, wherein transmitting includes:

transmitting optical signals in transmission media having a first cross-sectional area; and the method further comprising:

receiving the optical signals, after filtering the signals, via transmission media having a second cross-sectional area less than the first cross-sectional area.

8. The method of claim 1, wherein amplifying includes:

receiving optical signals via transmission media having a first cross-sectional area; and providing amplified optical signals via transmission media having a second cross-sectional area greater than the first cross-sectional area.

9. The method of claim 1, wherein:

transmitting includes transmitting optical signals in transmission media having a first cross-sectional area; and wherein amplifying includes receiving optical signals via transmission media having a second cross-sectional area less than the first cross-sectional area.

10. The method of claim 1, wherein the desired gain profile is a flat gain profile.

11. The method of claim 5, wherein monitoring system performance includes:

monitoring at least one pump source in at least one amplifier;

detecting degradation in performance of at least one pump source; and wherein amplifying optical signals differently includes:

amplifying optical signals differently in response to detecting significant degradation in performance of the at least one pump source.

12. The method of claim 11, wherein amplifying optical signals differently includes changing pump power in at least one other pump source.

13. The system of claim 6, further comprising:

a second plurality of amplifiers optically connected to the transmission media at a second plurality of separate locations between the filter and the receiver and collectively producing a second composite optical signal gain profile; and a second filter optically connected to the transmission media between the second plurality of amplifiers and the receiver, wherein the second filter corresponds to the second plurality of amplifiers and produces a second desired gain profile in response to the second composite optical signal gain profile.

14. The system of claim 6, wherein the transmission media includes:

transmission media having a first cross-sectional area optically connected to at least one of the transmitter and an output of at least one of the amplifiers; and transmission media having a second cross-sectional area optically connected to at least one of a receiver and an input of at least one of the amplifiers, wherein the second cross-sectional area is smaller than the first cross-sectional area.

15. The system of claim 6, wherein the relative intensity noise controlled pump source includes an output facet including at least one of an anti-reflective coating and an angled output facet.

* * * * *